(12) United States Patent
Qi et al.

(10) Patent No.: US 9,893,129 B2
(45) Date of Patent: Feb. 13, 2018

(54) METHOD FOR FABRICATING COA ARRAY SUBSTRATE, ARRAY SUBSTRATE AND DISPLAY DEVICE

(71) Applicant: BOE TECHNOLOGY GROUP CO., LTD., Beijing (CN)

(72) Inventors: Yonglian Qi, Beijing (CN); Shi Shu, Beijing (CN); Guanbao Hui, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 136 days.

(21) Appl. No.: 14/351,639

(22) PCT Filed: Jun. 19, 2013

(86) PCT No.: PCT/CN2013/077492
§ 371 (c)(1),
(2) Date: Apr. 14, 2014

(87) PCT Pub. No.: WO2014/153861
PCT Pub. Date: Oct. 2, 2014

(65) Prior Publication Data
US 2015/0340415 A1    Nov. 26, 2015

(30) Foreign Application Priority Data

Mar. 29, 2013  (CN) .......................... 2013 1 0108090

(51) Int. Cl.
| | | |
|---|---|---|
| *H01L 27/32* | (2006.01) | |
| *G02F 1/1368* | (2006.01) | |
| *H01L 51/56* | (2006.01) | |
| *H01L 21/768* | (2006.01) | |
| *H01L 23/535* | (2006.01) | |

(Continued)

(52) U.S. Cl.
CPC ........ *H01L 27/3248* (2013.01); *G02F 1/1362* (2013.01); *G02F 1/1368* (2013.01);

(Continued)

(58) Field of Classification Search
CPC .................................................. H01L 27/1288
See application file for complete search history.

(56) References Cited

U.S. PATENT DOCUMENTS

2009/0195735 A1*  8/2009  Huang ................. G02F 1/1362
349/106

FOREIGN PATENT DOCUMENTS

| CN | 101030586 A | 9/2007 |
|---|---|---|
| CN | 101661204 A | 3/2010 |

(Continued)

OTHER PUBLICATIONS

English translation of the International Preliminary Report on Patentability and Written Opinion of the International Searching Authority of PCT/CN2013/077492, issued Sep. 29, 2015.

(Continued)

*Primary Examiner* — Yu-Hsi D Sun
(74) *Attorney, Agent, or Firm* — Collard & Roe, P.C.

(57) ABSTRACT

A method for fabricating a COA array substrate, an array substrate and a display device are provided. The fabrication method comprises the following steps: forming a protection layer (12) on the TFT substrate (11); coating a photoresist layer (21) on the protection layer (12), the photoresist layer (12) functioning as a planarized layer (14), wherein the TFT substrate (11) comprises a substrate (111) and a TFT (112); forming a color filter receiving hole (32) in the photoresist layer (21) through a photolithography process; fabricating the color filter layer (31) in the color filter receiving hole (32). The above fabrication method can reduce the complexity and cost of conventional method for fabricating the array substrate.

6 Claims, 3 Drawing Sheets

(51) Int. Cl.
*G02F 1/1362* (2006.01)
*H01L 27/12* (2006.01)

(52) U.S. Cl.
CPC .. *H01L 21/76802* (2013.01); *H01L 21/76877* (2013.01); *H01L 23/535* (2013.01); *H01L 27/1259* (2013.01); *H01L 27/322* (2013.01); *H01L 51/56* (2013.01); *G02F 2001/136222* (2013.01); *H01L 2227/323* (2013.01); *H01L 2924/0002* (2013.01)

(56) References Cited

FOREIGN PATENT DOCUMENTS

| | | |
|---|---|---|
| CN | 102707357 A | 10/2012 |
| CN | 202837751 U | 3/2013 |

OTHER PUBLICATIONS

English Translation of the International Search Report of PCT/CN2013/077492 published in English on Oct. 2, 2014.
Chinese Office Action of Chinese Application No. 201310108090.1 with English translation, dated Jul. 3, 2014.
International Search Report, of PCT/CN2013/077492 in Chinese, dated Dec. 26, 2013.
International Preliminary Report on Patentability and Written Opinion of the International Searching Authority of PCT/CN2013/077492 in Chinese, dated Dec. 26, 2013.
Second Chinese Office Action of Chinese Application No. 201310108090.1, dated Feb. 27, 2015 with English translation.
Third Chinese Office Action of Chinese Application No. 201310108090.1, dated Jun. 28, 2016 with English translation.

* cited by examiner

METHOD FOR FABRICATING COA ARRAY SUBSTRATE, ARRAY SUBSTRATE AND DISPLAY DEVICE

CROSS REFERENCE TO RELATED APPLICATIONS

This application is the National Stage of PCT/CN2013/077492 filed on Jun. 19, 2013, which claims priority under 35 U.S.C. § 119 of Chinese Application No. 201310108090.1 filed on Mar. 29, 2013, the disclosure of which is incorporated by reference. The international application under PCT article 21(2) was not published in English.

FIELD OF THE ART

Embodiments of the invention relate to the field of liquid crystal display technologies, more particularly, to a method for fabricating a color filter on array (COA) array substrate, an array substrate and a display device.

BACKGROUND

COA array substrate refers to a TFT substrate 11 above which a color filter layer 13 is fabricated, wherein the TFT substrate 11 comprises a substrate 111 and a Thin Film Transistor (TFT) 112. With such a design, it can reduce the width of the black matrix while improving the aperture ratio of the display region. FIG. 1 illustrates a configuration of a conventional COA array substrate and FIG. 2 illustrates an exposing procedure for forming a via hole 15.

Currently, methods for fabricating the color filter layer on the TFT substrate mainly involve patterning process or ink-jet printing process. A separately fabricated barricade structure is required for the conventional ink-jet printing process, which is then removed after finishing fabricating the color filter layer 13 (the color filter layer is formed by coating a protection layer 12 on the TFT substrate and then performing a patterning process). Thereafter a planarized layer 14 is formed, thereby forming the COA array substrate structure. Meanwhile, a separate patterning process is required to form the via hole 15. Therefore, the process is complicated and the production efficiency is low while the cost is high.

SUMMARY

Embodiments of the invention provide a method for fabricating an array substrate, an array substrate and a display device which can reduce the fabrication processes and the cost while improving the production efficiency.

A first aspect of the invention provides a method for fabricating a COA array substrate, the COA array substrate comprises a TFT substrate and a color filter layer disposed on the TFT substrate, the method comprises the following steps: forming a protection layer on the TFT substrate; coating a photoresist layer on the protection layer, the photoresist layer functions as a planarized layer, wherein the TFT substrate comprises a substrate and a TFT; forming a color filter receiving hole in the photoresist layer through a photolithography process; fabricating the color filter layer in the color filter receiving hole.

The photoresist layer in the invention has a good fluidity, therefore the step different is very small. As a result, the photoresist layer may function as the planarized layer at the same time. A pattern comprising the color filter receiving hole is formed by exposing and developing the photoresist layer through a patterning process. In comparison with conventional method for fabricating an array substrate, the planarized layer is no longer formed separately, making the manufacturing step simple while saving production cost.

A second aspect of the invention provides a COA array substrate, comprising a photoresist layer 21 disposed on a protection layer 12, the photoresist layer 21 functions a planarized layer, a color filter receiving hole 32 is formed in the photoresist layer, and a color filter layer 13 is formed in the color filter receiving hole 32.

As the photoresist layer of the array substrate according to the invention not only has the color filter receiving hole formed therein but also functions as the planarized layer, the cost of the array substrate is low.

A third aspect of the invention provides a display device comprising the above COA array substrate.

The display device is of low cost and simple manufacturing steps as it is provided with the above array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

NUMERAL REFERENCES

Figure 1:
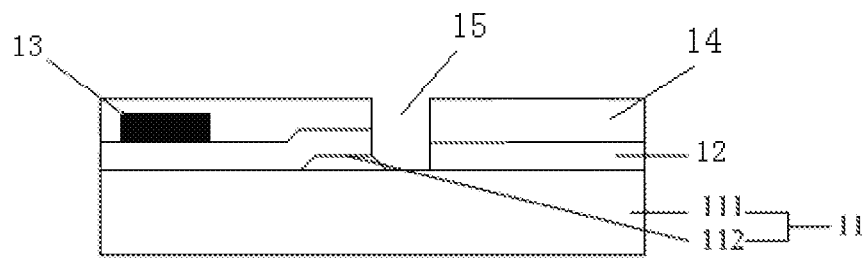
FIG. 1 schematically illustrates a configuration of a conventional COA array substrate.
Figure 2:
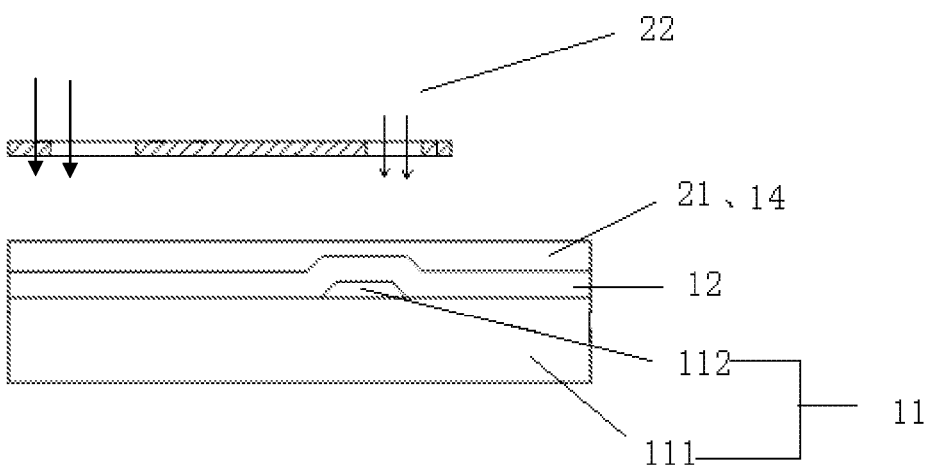
FIG. 2 schematically illustrates a diagram of exposing a photoresist layer of a COA array substrate in a method for fabricating an array substrate in accordance with Embodiment 1 of the invention.

11—TFT substrate; 111—substrate; 112—TFT; 12—protection layer; 13—color filter layer; 14—planarized layer; 15—via hole; 21—photoresist layer; 22—mask; 31—first via hole; 32—color filter receiving hole.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiment 1

With reference to FIGS. 3 to 6, the embodiment of the invention provides a method for fabricating a COA array substrate, comprising:

Step 1: first forming components such as a TFT 112 and metal wires on a substrate 111 to finish fabricating a TFT substrate 11; forming a protection layer 12 on the TFT substrate 11, wherein the protection layer 12 is configured for protecting the substrate.

Step 2: coating a photoresist layer 21 on the protection layer 12, exposing the photoresist layer 21 with a mask 22 through a patterning process, the exposed region is a color pixel region; developing the color pixel region after exposing; then baking to form a color filter receiving hole 32; the photoresist layer 21 also functions as a planarized layer 14.

Step 3: adding dyestuff into the color filter receiving hole 32 to form a color filter layer 13. Herein, as the step difference of the photoresist layer 21 is very small, the photoresist layer 21 may also function as the planarized layer 14. Therefore there is no need to fabricate the planarized layer 14, making the fabrication process simple, production efficiency high and cost low.

Preferably, forming the color filter layer in the color filter receiving hole 32 comprises: forming the color filter layer 13 in the color filter receiving hole 32 by ink-jet printing process. In the method provided by the embodiment, the photoresist layer 21 is exposed and developed during the patterning process to form the color filter receiving hole 32. As a positive photoresist is used to fabricate the color filter receiving hole 32, the photoresist will still exist in other regions after the developing (in the case of using a negative photoresist, the region having the color filter receiving hole 32 is not irradiated while other regions are irradiated, therefore the photoresist still exist in other regions after the developing). The remaining photoresist layer 21 actually forms a barricade. In this case, there is no need for separately forming the barricade when using ink-jet printing process to form the color filter layer 13. In comparison with conventional fabrication method, the step of forming the barricade is omitted, which can significantly improve the production efficiency and reduce the production cost.

Figure 3:
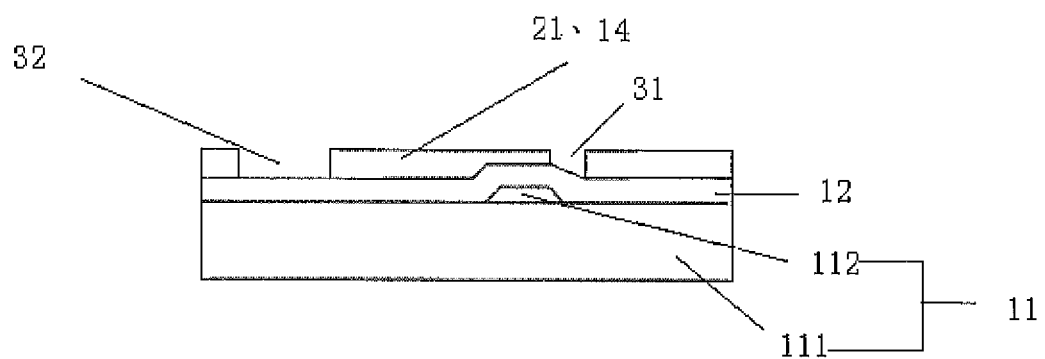
FIG. 3 schematically illustrates a diagram after exposing the photoresist layer of the COA array substrate in the method for fabricating the COA array substrate in accordance with Embodiment 1 of the invention.
Figure 4:
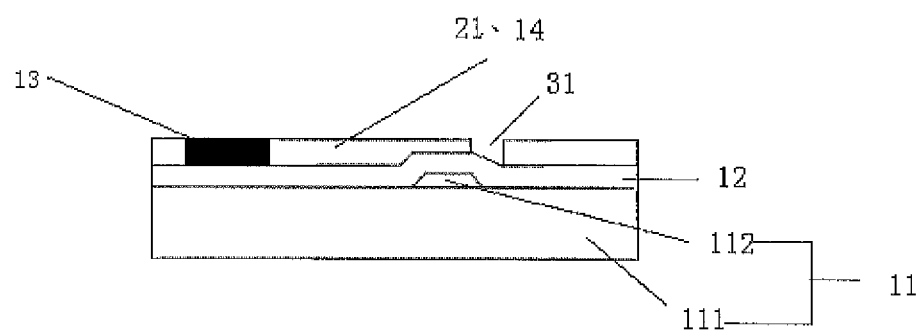
FIG. 4 schematically illustrates a diagram of fabricating a color filter layer of the COA array substrate in the method for fabricating the COA array substrate in accordance with Embodiment 1 of the invention.
Figure 5:
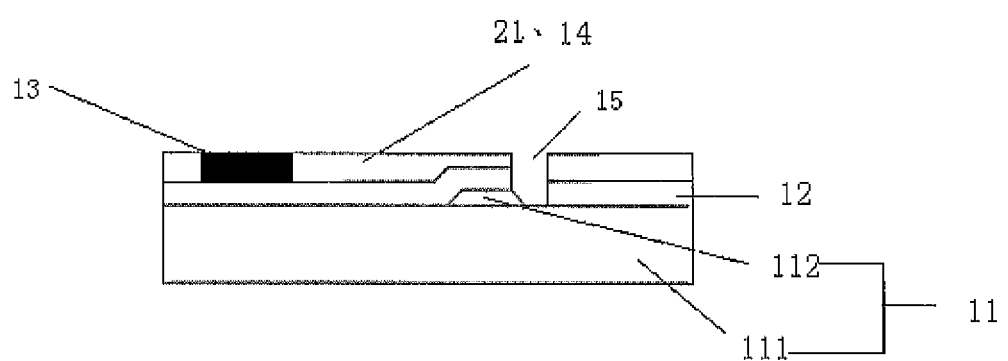
FIG. 5 schematically illustrates a diagram of fabricating a via hole above the COA array substrate in the method for fabricating the COA array substrate in accordance with Embodiment 1 of the invention.

Preferably, the COA array substrate is an OLED array substrate, and step 2 comprises:

with reference to FIG. 3, forming the color filter receiving hole 32 and a first via hole 31 through a single patterning process, wherein the first via hole 31 penetrates through the planarized layer 14;

with reference to FIG. 5, etching the protection layer 12 in the first via hole 31 region to form a via hole 15 exposing a drain electrode of the TFT 112.

After forming the color filter layer 13 at step 3, the method further comprises: forming an OLED anode on the color filter layer 13, the OLED anode is electrically connected to the drain electrode of the TFT 112 through the via hole 15.

The OLED anode may also be formed on the TFT substrate 11, the OLED anode may be directly connected to the drain electrode of the TFT 112; in this case there is no need to form the via hole 15 through the patterning process.

Preferably, the COA array substrate is a TFT-LCD array substrate, and step 2 comprises:

with reference to FIG. 3, forming the color filter receiving hole 32 and a first via hole 31 through a single patterning process, the first via hole 31 penetrates through the planarized layer 14;

with reference to FIG. 5, etching the protection layer 12 in the first via hole 31 region to form a via hole 15 exposing a drain electrode of the TFT 112;

After forming the color filter layer 13 at step 3, the method further comprises: forming a pixel electrode on the color filter layer 13, the pixel electrode is connected to a drain electrode of the TFT 112 through the via hole 15.

The pixel electrode may also be formed on the TFT substrate 11, the pixel electrode may be directly connected to the drain electrode of the TFT 112; in this case there is no need to form the via hole 15 through the patterning process.

Embodiment 2

The embodiment provides an array substrate, comprising a photoresist layer 21 disposed on a protection layer 12, wherein the photoresist layer 21 functions as a planarized layer 14, a color filter receiving hole 32 is formed in the photoresist layer 21, a color filter layer 13 is formed in the color filter receiving hole 32. As the photoresist layer 21 functions as the planarized layer 14, the cost can be saved during fabrication.

Preferably, the array substrate is an OLED array substrate, a via hole 15 penetrating through the photoresist layer 14 and the protection layer 12 is disposed on the COA array substrate, an OLED anode is electrically connected to a drain electrode of a TFT 112 on the OLED substrate through the via hole 15. It can be contemplated that the OLED may also be formed on the TFT substrate 11, the OLED anode is directly connected to the drain electrode of the TFT 112; in this case there is no need to form the via hole 15.

Preferably, the array substrate is a TFT-LCD array substrate, a via hole 15 penetrating through the photoresist layer 14 and the protection layer 12 is disposed on the COA array substrate, a pixel electrode is electrically connected to a drain electrode of a TFT 112 on the TFT-LCD array substrate through the via hole 15. It can be contemplated that the pixel electrode may also be formed on the TFT substrate 11, the pixel electrode may be directly connected to the drain electrode of the TFT 112; in this case there is no need to form the via hole 15.

The COA array substrate of the embodiment may be fabricated by using the fabrication method of Embodiment 1 without the need for the planarized layer 14 and the barricade. Detailed description will not be provided. The array substrate thus has high production efficiency and a low cost.

Embodiment 3

The embodiment provides a display device comprising the above array substrate. It may also comprise conventional structures of the display device such as a frame.

An example of the display device is a liquid crystal display (LCD) device, wherein an array substrate and an opposed substrate are disposed opposed to each other to form a liquid crystal cell, a liquid crystal material is filled in the liquid crystal cell. The opposed substrate is for example a color filter substrate. A pixel electrode of each pixel unit of the array substrate is adapted to applying an electric field to control the rotation of the liquid crystal material, thereby displaying images. In some examples, the LCD device further comprises a backlight module for providing backlight to the array substrate.

Another example of the display device is an organic electroluminescent display (OLED) device, wherein an organic light emitting layer is formed on the array substrate, a pixel electrode of the pixel unit functions an anode or a cathode for driving the organic light emitting layer to display images.

As the display device comprises the array substrate, the fabrication process is simple and the cost is low.

What are described above is related to the illustrative embodiments of the disclosure only and not limitative to the scope of the disclosure; the scopes of the disclosure are defined by the accompanying claims.

What is claimed is:

1. A method for fabricating a COA array substrate, the COA array substrate comprising a TFT substrate and a color filter layer disposed on the TFT substrate, the method comprising the following steps:
   forming a protection layer on the TFT substrate;
   coating a photoresist layer on the protection layer, wherein the TFT substrate comprises a substrate and a TFT;
   forming a color filter receiving hole in the photoresist layer through a photolithography process;
   fabricating the color filter layer in the color filter receiving hole,
   wherein the photoresist layer is remained as part of the COA array substrate after fabricating a pixel electrode on the COA array substrate, and an entire surface of the photoresist layer is flushed with an entire surface of the color filter layer such that the photoresist layer functions as a barricade and a planarized layer.

2. The method for fabricating the COA array substrate of claim 1, wherein a method for fabricating the color filter layer in the color filter receiving hole is ink-jet printing process.

3. The method for fabricating the COA array substrate of claim 1, further comprising forming a via hole at the same time as forming the color filter receiving hole.

4. The method for fabricating the COA array substrate of claim 3, wherein the COA array substrate is an OLED array substrate, the step of forming the via hole at the same time as forming the color filter receiving hole comprises:
   forming the color filter receiving hole and a first via hole through a single patterning process, the first via hole penetrates through the planarized layer;
   etching the protection layer in the first via hole region to form a via hole exposing a drain electrode of the TFT;
   fabricating an OLED anode on the color filter layer, the OLED anode is electrically connected to the drain electrode of the TFT through the via hole.

5. The method of claim 3, wherein the COA array substrate is a TFT-LCD array substrate, the step of forming the via hole at the same time as forming the color filter receiving hole comprises:
   forming the color filter receiving hole and a first via hole through a single patterning process, the first via hole penetrates through the planarized layer;
   etching the protection layer in the first via hole region to form a via hole exposing a drain electrode of the TFT;
   forming the pixel electrode on the color filter layer, the pixel electrode is electrically connected to a drain electrode of the TFT through the via hole.

6. The method for fabricating the COA array substrate of claim 1, wherein the entire surface of the photoresist layer and an entire surface of the color filter layer are located in a same horizontal plane.

\* \* \* \* \*